(12) United States Patent
Schlaffer et al.

(10) Patent No.: US 11,864,306 B2
(45) Date of Patent: Jan. 2, 2024

(54) COMPONENT CARRIER WITH AN EMBEDDED THERMALLY CONDUCTIVE BLOCK AND MANUFACTURING METHOD

(71) Applicant: AT&S Austria Technologie & Systemtechnik Aktiengesellschaft, Leoben (AT)

(72) Inventors: Erich Schlaffer, St. Lorenzen (AT); Sebastian Sattler, Graz (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 40 days.

(21) Appl. No.: 17/302,061

(22) Filed: Apr. 22, 2021

(65) Prior Publication Data
US 2021/0337653 A1 Oct. 28, 2021

(30) Foreign Application Priority Data

Apr. 27, 2020 (EP) .................................... 20171558

(51) Int. Cl.
*H05K 1/02* (2006.01)
*H05K 1/18* (2006.01)
*H05K 3/46* (2006.01)

(52) U.S. Cl.
CPC ........... *H05K 1/0204* (2013.01); *H05K 1/185* (2013.01); *H05K 3/4611* (2013.01); *H05K 2201/10416* (2013.01); *H05K 2203/061* (2013.01)

(58) Field of Classification Search
CPC ....... H05K 1/0201–0212; H05K 1/185; H05K 1/0298; H05K 3/301; H05K 3/429; H05K 3/4644; H05K 3/4611; H05K 7/2039; H05K 2201/068; H05K 2201/10416; H05K 2203/061; H01L 23/3672; H01L 23/367; H01L 23/3675; H01L 23/3735; H01L 23/5383; H01L 23/5389; H01L 23/552; H01L 23/5226; H01L 24/18; H01L 24/25;
(Continued)

(56) References Cited

U.S. PATENT DOCUMENTS 11,107,744 B2 * 8/2021 Zhong .................. H01L 25/072
2009/0091903 A1 4/2009 Hsu et al.
(Continued)

OTHER PUBLICATIONS

Goethals, F .; Extended European Search Report in Application No. 20171558.8; pp. 1-10; dated Oct. 22, 2020; European Patent Office; 80298, Munich, Germany.

*Primary Examiner* — Amir A Jalali
(74) *Attorney, Agent, or Firm* — Robert A. Blaha; Smith Tempel Blaha LLC (57) ABSTRACT

A component carrier includes i) a first layer stack having a first electrically conductive layer structure and/or at least one first electrically insulating layer structure, ii) a component embedded in the first layer stack, iii) a second layer stack having at least one second electrically conductive layer structure and/or at least one second electrically insulating layer structure, and iv) a thermally conductive block embedded in the second layer stack. Hereby, the first layer stack and the second layer stack are connected with each other so that a thermal path from the embedded component via the thermally conductive block up to an exterior surface of the component carrier has a minimum thermal conductivity of at least 7 W/mK, in particular at least 40 W/mK. Further, a method of manufacturing the component carrier is described.

17 Claims, 2 Drawing Sheets

(58) Field of Classification Search
CPC ....... H01L 24/32; H01L 24/73; H01L 25/105; H01L 2224/2402; H01L 2224/24141; H01L 2224/24265; H01L 2224/25171; H01L 2224/32267; H01L 2224/32227; H01L 2224/33051; H01L 2224/33519; H01L 2224/32057
See application file for complete search history.

(56) References Cited

U.S. PATENT DOCUMENTS

| | | | | |
|---|---|---|---|---|
| 2009/0185352 | A1* | 7/2009 | Ellsworth | H05K 7/209 |
| | | | | 29/829 |
| 2012/0024575 | A1* | 2/2012 | Zhang | H01L 23/3677 |
| | | | | 29/832 |
| 2014/0061692 | A1* | 3/2014 | Preuschl | H05K 1/0206 |
| | | | | 257/91 |
| 2014/0211437 | A1 | 7/2014 | Ueta | |
| 2015/0084170 | A1* | 3/2015 | Im | H01L 23/3677 |
| | | | | 438/107 |
| 2015/0206820 | A1* | 7/2015 | Standing | H01L 23/3733 |
| | | | | 257/717 |
| 2016/0050771 | A1 | 2/2016 | Yu et al. | |
| 2016/0309575 | A1* | 10/2016 | Min | H05K 3/4602 |
| 2017/0280552 | A1* | 9/2017 | Wiesa | H01L 23/367 |
| 2018/0190563 | A1* | 7/2018 | Magni | H01L 23/3735 |
| 2018/0211899 | A1* | 7/2018 | Morianz | H01L 24/20 |
| 2018/0233429 | A1* | 8/2018 | Yosui | H01L 23/3677 |
| 2018/0241285 | A1 | 8/2018 | Sasaki et al. | |
| 2018/0302977 | A1* | 10/2018 | Kezuka | H01L 21/486 |
| 2019/0132983 | A1* | 5/2019 | Weis | H01L 24/82 |
| 2019/0164892 | A1 | 5/2019 | Franz et al. | |
| 2019/0164938 | A1* | 5/2019 | Lee | H01L 23/552 |
| 2019/0378801 | A1* | 12/2019 | Leitgeb | H01L 23/552 |
| 2020/0312737 | A1* | 10/2020 | Stahr | H01L 23/5389 |
| 2021/0045227 | A1* | 2/2021 | Mayr | H05K 1/0219 |
| 2021/0084747 | A1* | 3/2021 | Schrems | H05K 1/114 |
| 2021/0127478 | A1* | 4/2021 | Feng | H05K 3/0035 |
| 2021/0194111 | A1* | 6/2021 | Weis | H01Q 1/2291 |
| 2021/0267044 | A1* | 8/2021 | Frauwallner | H01L 24/20 |

* cited by examiner

COMPONENT CARRIER WITH AN EMBEDDED THERMALLY CONDUCTIVE BLOCK AND MANUFACTURING METHOD

CROSS-REFERENCE TO RELATED APPLICATION

The present application claims the benefit of the filing date of the European Patent Application No. 20 171 558.8, filed Apr. 27, 2020, the disclosure of which is hereby incorporated herein by reference.

TECHNICAL FIELD

Embodiments of the invention relate to a component carrier and a method of manufacturing the component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically and magnetically reliable so as to be operable even under harsh conditions.

In particular, the embedding of active and passive components in a component carrier, such as a substrate or a printed circuit board, is a challenge. Advantages of the embedding technologies may include size reduction, stabile performance, and high reliability. Thus, embedded technologies may require precisely fitting that goes along with the reduced sizes. Further, while the performance of the embedded components (in particular chips) is continuously increased, these components may generate massive amounts of heat. Therefore, new concepts for heat dissipation and thermal management (in a component carrier with an embedded component may be required.

According to a prior art example, a die may be embedded in a circuit board that comprises dielectric material and copper traces. The die generates a high amount of heat which has to be dissipated. For this purpose, the copper trace may be applied to dissipate heat in the direction of main extension of the circuit board (the X-axis). However, there is no further concept of dissipating heat efficiently, in particular not in the height direction (along the Z-axis) of the circuit board.

SUMMARY

There may be a need to provide a component carrier (in particular with an embedded component) with an efficient heat dissipation and thermal management (in particular along the Z-axis of the component carrier).

A component carrier and a method of manufacturing the component carrier according to the independent claims are provided. The dependent claims describe advantageous embodiments.

According to an exemplary embodiment of the invention, a component carrier (e.g., a substrate or a printed circuit board) is provided. The component carrier comprises: i) a first (layer) stack comprising at least one first electrically conductive layer structure and/or at least one first electrically insulating layer structure, ii) a component (e.g., a die or a chip) embedded in the first layer stack, iii) a second (layer) stack comprising at least one second electrically conductive layer structure and/or at least one second electrically insulating layer structure, and iv) a thermally conductive block (e.g., a copper block) embedded in the second layer stack. Hereby, the first layer stack and the second layer stack are connected (e.g., via a thermally conductive coupling material such as an electrically conductive sinter paste) with each other so that a thermal path (in particular an entire thermal path), that extends from the embedded component via the (embedded) thermally conductive block (up or down, respectively) to an exterior (main) surface of the component carrier, has a minimum thermal conductivity of at least 7 W/mK (in particular at least 20 W/mK, more in particular at least 40 W/mK).

According to another exemplary embodiment of the invention, a method of manufacturing a component carrier is provided, wherein the method comprises: i) embedding a component in a first layer stack comprising at least one first electrically conductive layer structure and/or at least one first electrically insulating layer structure, ii) embedding a thermally conductive block in a second layer stack comprising at least one second electrically conductive layer structure and/or at least one second electrically insulating layer structure, and iii) connecting the first layer stack with the second layer stack so that a thermal path from the embedded component via the thermally conductive block up to an exterior surface of the component carrier has a thermal conductivity of at least 7 W/mK (in particular 40 W/mK).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a (layer) stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In the context of the present application, the term "thermally conductive block" may particularly denote any compact and massive structure that comprises a favorable thermal conductivity (e.g., more than 7 W/mK) and that can be embedded in a layer stack of a component carrier. A "block" may be at least partially polygonal. A block can further have a rectangular-shape or a cube-shape. In a specific example, a block may also have at least partially a round shape, in particular the shape of a sphere or a cylinder. A thermally conductive block may (at least partially) comprise metal such as copper. For example, the block may be a copper block. In an example, a thermally conductive block may be connected (in particular by a thermally conductive coupling medium, e.g., sinter paste) to an (embedded electronic) component. In this case, the block may efficiently dissipate heat produced by the component. Hereby, the heat may be guided through the block and (e.g., using a via) to an exterior surface of the component carrier. The block may have the same size (in particular width) as the component or may be larger than the component.

In the context of the present application, the term "thermal path" may particularly denote a defined distance along which heat is transported. For example, a thermal path may be established between a heat source and a heat sink. In a specific example, a thermal path may be established between an embedded electronic component and an exterior surface of a component carrier, in which the electronic component is embedded. In particular, a thermally conductive block may be arranged in between the embedded component and the exterior surface, thereby also forming part of the thermal path. A thermal path may comprise a defined thermal conductivity, for example at least 7 W/mK (or at least 40 W/mK). A thermal path may also be an electrically conductive path.

According to an exemplary embodiment, the invention may be based on the idea that a component carrier with an efficient heat dissipation and thermal management (in particular along the Z-axis) can be provided, when the component carrier comprises at least two layer stacks, wherein the first layer stack comprises an embedded (electronic) component and the second layer stack comprises an embedded thermally conductive block. These two layer stacks may be stacked one upon the other (to from the component carrier) so that the embedded heat producing component and the embedded heat dissipating thermally conductive block are thermally coupled so that a thermal path is formed. Along said path, the heat produced by the embedded component can be guided via the embedded block to an exterior (main) surface of the component carrier. The thermal path may hereby be arranged so that it comprises an advantageous thermal conductivity of at least 7 W/mK (or at least 40 W/mK). The two layer stacks may be efficiently connected without low thermally conductive barriers in between. Even though an efficient thermal management is provided, the component carrier may still be provided with small measures. This is because the described highly efficient thermal spreading along the Z-axis may be realized by a short thermal path in the height direction of the component carrier. While the prior art (see above) teaches to apply heat dissipation (of heat produced by embedded electronic components) intensively along the X- and Y-axes of a component carrier, it has been surprisingly found that a very efficient heat dissipation and thermal management, without significantly increasing the size of the component carrier, can be provided along the Z-axis, when applying an embedded thermally conductive block (above or below the embedded electronic component).

According to an embodiment, the thermal path is oriented (at least partially) along the Z-axis of the component carrier. This may provide the advantage that an efficient heat dissipation and thermal management along the height direction of the component carrier is enabled.

In principle, a component carrier may be shaped as a plate. A plate comprises two directions of main extension along the X-axis (length) and the Y-axis (depth). Generally, the extension in the height direction (being perpendicular to the directions of main extension) along the Z-axis is significantly shorter than the two directions of main extension. By applying the described thermal path (in particular stacking the embedded component and the embedded block), an efficient heat transport from the embedded component along the Z-axis (essentially parallel to the Z-Axis) through the embedded block up to the exterior (main) surface (which may be parallel to the X- and Y-axis) of the component carrier may be provided.

According to a further embodiment, the thermal path is continuously electrically conductive. This may provide the advantage that the thermal path can be used in a flexible manner, for example as a further electrically conductive path.

In an example, there may be arranged only electrically conductive material along the thermal path. More specifically, electric contacts of the embedded component may be connected via a thermally and electrically conductive coupling medium (e.g., sinter paste or conductive connection structures) to the embedded block. The block may be an electrically conductive copper block which is connected by electrically conductive vias (or other electrically conductive connection structures) to the exterior surface of the component carrier.

According to a further embodiment, the component carrier further comprises a thermally conductive coupling medium arranged at an interface between the thermally conductive block and the embedded component. This may provide the advantage that the embedded component and the embedded block can be connected in a flexible but also robust manner.

The thermally conductive coupling medium may for example comprise a thermally conductive paste. In particular, the thermally conductive paste comprises a sinter paste or a solder paste. This may enable an efficient connection at the interface between component and block.

In another example, the thermally conductive coupling medium comprises an electrically conductive coupling structure such as a copper layer and/or one or more (copper filled) (micro) vias. In this manner, the thermally conductive coupling medium can be also an efficient electrically conductive material.

According to a further embodiment, any suitable coupling medium could be used to couple the first stack and the second stack. In one example, the thermally conductive coupling medium may be a continuous layer. In another example, the thermally conductive coupling medium may be a discontinuous manner, e.g., comprising separated islands and/or pad(s). In a specific embodiment, the coupling medium is only thermally conductive at an interface between the component embedded in the first stack and the thermally conductive block embedded in the second stack. In an example, further parts of the thermally conductive coupling medium may be (essentially) not thermally conductive (or only optionally, depending on the necessary design/application). In an example, the thermally conductive coupling medium is only (efficiently) thermally conductive (e.g., at least 7 W/mK, in particular at least 40 W/mK) at the described interface (region). This may provide the advantage that heat is (essentially) only dissipated in the Z-direction and not in the X,Y-directions.

In a further specific embodiment, a further (third) layer stack is arranged below the second layer stack, wherein the further layer stack comprises a further thermally conductive block (in particular larger than the thermally conductive block). In this manner, a very efficient thermal path from the embedded component via two (or more) thermal blocks (along the Z-direction) may be enabled.

According to a further embodiment, the embedded electronic component is a chip (in particular a power chip or a high frequency chip). This may provide the advantage that high-level (or high-end) chips that operate with a higher-than-average energy (power chip) and/or a higher-than-average speed (and accordingly generate a higher-than-average amount of heat) can be applied in a component carrier, while an efficient heat management is provided and over-heating is prevented.

According to a further embodiment, the thermally conductive block is a metal block, in particular a copper block. This may provide the advantage that the thermally (and electrically) conductive block can be provided in a cost-efficient manner by using industry-relevant materials.

In an example, the shape of the thermal block may at least one of cylindric, cubic, trapezoid, prism. For example, the shape of the thermal block may be similar to that of a house or a coffin (a cubic base and a prism on top). The form of the block may be tuned according to the design of the overall architecture, the component carrier, the heat generating component itself, etc.

According to a further embodiment, a lateral extension (e.g., width or length) of the thermally conductive block is (essentially) equal to or larger than a lateral extension of the embedded component. This may provide the advantage that the heat dissipation is very efficient, because the thermally conductive block covers one exterior surface (or more) of the heat-producing embedded component. In an example, the block and the component have essentially the same size (in particular with respect to the width). In another example, the block is larger (in particular significantly larger) than the component (in particular with respect to the width).

According to a further embodiment, the thermal path has a minimum width of at least 90% of the width of the embedded electronic component. In particular, the thermal path has a minimum width of at least the width of the embedded component. This may provide the advantage that the heat dissipation is very efficient, because the thermal path dissipates heat from 90% or more of an exterior (main) surface of the heat-producing embedded component.

According to a further embodiment, an electric signal of the embedded component is conducted exclusively to a further exterior surface of the component carrier, wherein the further exterior surface opposes the exterior surface (is arranged opposite to the exterior surface, e.g., also parallel to the X-axis and Y-axis). This may provide the advantage that an efficient separation between an electrically conductive signal path and a thermally conductive heat path is established. In an embodiment, the signal path and the thermal path may extend opposite to each other, for example the signal path may extend to the upper main surface (further exterior surface) of the component carrier and the thermal path may extend to the lower main surface (exterior surface) of the component carrier.

According to a further embodiment, the first layer stack and the second layer stack have different integration densities and/or are made of different materials. This may provide the advantage that first layer stack and second layer stack can be combined in a flexible manner.

According to a further embodiment, the exterior main surface and/or the further exterior main surface of the component carrier is/are connected with a casing or a heat sink (and/or a further (larger) thermal block, in particular in a further stack). This may provide the advantage that the heat dissipation is even more efficient. The thermal path could extend from the exterior surface of the component carrier to a heat sink (or casing) in order to remove heat from the component carrier layer stacks.

According to a further embodiment, the method further comprises: applying a thermally conductive coupling medium at an interface between the thermally conductive block and the embedded component, wherein the thermally conductive coupling medium is applied to the thermally conductive block before connecting the first layer stack with the second layer stack. This may provide the advantage, that the embedded component and the embedded block can be connected in a flexible but robust manner.

According to a further embodiment, the method further comprising: connecting the thermally conductive block and the embedded component using thermocompression bonding. This may provide the advantage that the connections are robust, while an efficient thermal path is provided.

The term "thermocompression bonding" (or diffusion bonding, pressure joining, thermocompression welding or solid-state welding) may refer to a technique, whereby two metals, e.g., copper, are brought into atomic contact by applying force and heat simultaneously. The diffusion may require atomic contact between the surfaces due to the atomic motion. The atoms migrate from one crystal lattice to the other one based on crystal lattice vibration. This atomic interaction may then stick the interfaces together.

According to a further embodiment, the component is embedded (in the first layer stack) such that a main surface of the component is (essentially) flush with an outer main surface of the first layer stack. This may provide the advantage that a continuous layer stack (comprising the first layer stack and the second layer stack) is achieved, wherein the component may be brought in close proximity to the thermally conductive block. The described configuration may result directly from the manufacturing process, e.g., after a temporary carrier is removed onto which the component had been originally placed (see FIGS. 1 to 3). The term "main surface" of the component may refer to an exterior surface of the component. The main surface may be planar (e.g., a die surface) or may comprise electrically conductive pads. In the latter case, the electrically conductive pads may be flush with the first layer stack outer main surface.

According to a further embodiment, the thermally conductive block is embedded such that a main surface of the thermally conductive block is flush with an outer main surface of the second layer stack. This may provide the advantage that a continuous layer stack (comprising the first layer stack and the second layer stack) is achieved, wherein the thermally conductive block may be brought in close proximity to the component. The described configuration may result directly from the manufacturing process, e.g., after a temporary carrier is removed onto which the block had been originally placed (see FIGS. 4 to 6). The term "main surface" of the thermally conductive block may refer to an exterior surface, e.g., a copper surface. In an example, the main surface may be planar.

According to a further embodiment, the first layer stack and the second layer stack are connected by an electrically insulating layer (in particular a resin layer). Also, this measure may provide the advantage that a continuous (and robust) layer stack (comprising the first layer stack and the second layer stack) is achieved, wherein the thermally conductive block may be brought in close proximity to the component. The electrically insulating layer may for example comprise a resin, a prepreg and/or an adhesive material, so that the first layer stack and the second layer stack may be coupled in an efficient and robust manner.

According to a further embodiment, the electrically insulating layer comprises an opening at an interface between the component and the thermally conductive block.

According to a further embodiment, the electrically insulating layer comprises an opening at an interface between the component and the thermally conductive block. In a further embodiment, (at least a part of) the thermally conductive coupling medium (in particular a paste) is arranged within the opening to thermally (and electrically) connect the component and the thermally conductive block. In this manner, the layer stacks may be robustly connected (by the electrically insulating layer), while an efficient thermal (and electrical) connection is established between the component and the thermally conductive block.

According to a further embodiment, the electrically insulating layer is arranged (directly) between a first electrically conductive layer structure of the first layer stack and a second electrically conductive layer structure of the second layer stack.

According to a further embodiment, the electrically insulating layer comprises a plurality of openings (not only at the interface) in which thermally conductive material is arranged, respectively. In particular, the thermally conductive material may be arranged in openings between the first electrically conductive layer structure of the first layer stack and the second electrically conductive layer structure of the second layer stack, wherein in at least a part of the openings thermally conductive material is arranged in order to thermally (and electrically) connect the first electrically conductive layer structure and the second electrically conductive layer structure. This may provide the advantage that the whole (continuous) layer stack comprises a high performance regarding heat dissipation. Further, complex circuit designs may be realized efficiently, as both layer stacks may be used for signal routing.

According to a further embodiment, the electrically insulating layer comprises a thermally (highly) conductive material, for example resin incorporating filling agents such as metal oxide (e.g., $Al_2O_3$) or a material that comprises AlN (aluminum nitride).

According to a further embodiment, the electrically insulating layer comprises a thickness (an extension along the z-direction of the component carrier) that is (essentially) equal to a thickness of the thermally conductive material (in particular paste) which is arranged in the opening(s) of the electrically insulating layer.

According to a further embodiment, the thermally conductive material directly connects the component and the thermally conductive block without a further layer/material in between.

According to a further embodiment, the electrically insulating layer connects the layer stacks over their entire main surfaces with exception of the thermal path(s) through the opening(s).

According to a further embodiment, the first layer stack and the second layer stack are connected by an electrically conductive connection layer structure (e.g., copper material). In an example, a first electrically conductive layer structure from the first layer stack may be connected to a second electrically conductive layer structure of the second layer stack. In another example, the electrically conductive connection layer structure is provided separately in order to connect the first layer stack and the second layer stack. According to a further example, the electrically conductive connection layer structure may substitute (may be used instead of) the above described electrically insulating layer. Thus, the specifications described for the electrically insulating layer here may also hold true for the electrically conductive connection layer structure. In a specific embodiment, there is at least one opening (in particular a plurality of openings) within the described electrically conductive connection layer structure. So called via-in-via connections may be established through said openings. In this manner, further electric/thermic connections between the first layer stack and the second layer stack may be realized.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one (embedded) component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained. After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a center core embedding PCB is interconnected along the Z-axis with a massive heat dissipation core. In this manner, an excellent thermal path along the Z-axis can be achieved without any low thermal conductive barrier layer. Critical design layer and heat dissipation layer can be separated and optimized. There is a combination of embedded active components and copper blocks in Z-axis without any (low) thermally conductive barrier. Both boards can be combined with Z-interconnect concepts. This principle can be addressed for example to applications like high power chips or high-performance radio frequency chips with IC material like at least one of gallium arsenide (GaAs), gallium nitride (GaN), gallium oxide ($Ga_2O_3$). Further application can include: embedded components for power electronic photovoltaic inverters, 5G power components, battery chargers, mm-wave 5G and radar components.

According to a further exemplary embodiment, the following steps can be performed: i) a GaN embedded core (a first layer stack) is provided, ii) an active/passive component is embedded in the core by using CCE Technology and/or Parsec technology, iii) a HDI layer is connected by laser drilling and via filling with copper, iv) a thermal spreading core (a second layer stack) is manufactured with copper inlay or material with high thermal conductivity (a thermal conductive block), v) the thermal spreading layer is interconnected by laser drilling and via filling with copper. In a specific solution, dielectric material is removed by a 2.5-D concept with interconnection by copper over the entire surface. vi) a thermally conductive paste (a thermally conductive coupling medium) is applied onto the entire thermal conductive block, and vii) the embedded core and the thermal spreading layer are connected in the Z-axis (in order to form a component carrier).

According to a further exemplary embodiment, the two boards (layer stacks) can be laminated (after testing) together in a standard PCB process, whereby the electrically insulating layer (which may be a thermally conductive layer) glues the two boards over the whole surface together with exception of the thermal paths as well as other electric contacts between the boards which are made by the thermally conductive coupling medium, preferably a conductive paste. By this means very complex circuit designs can be realized efficiently, as both boards can be used for signal routing.

Figures 1, 2:
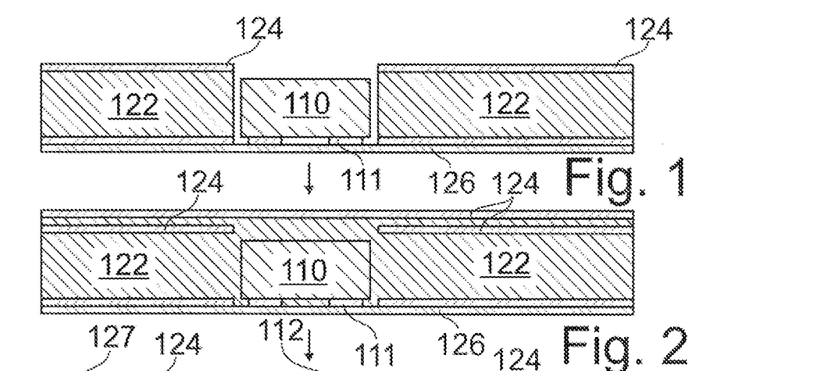
FIG. 1, FIG. 2 and FIG. 3 illustrate a manufacturing of a first layer stack with an embedded component according to exemplary embodiments of the invention.
Figure 3:
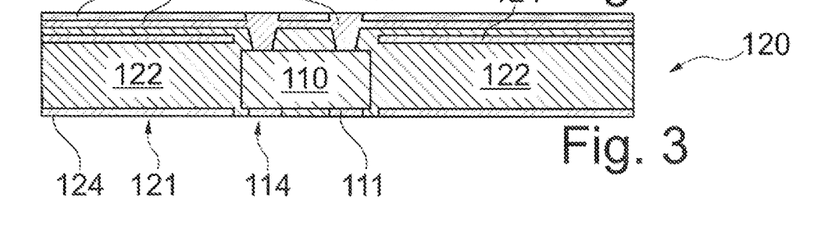

FIGS. 1 to 3 illustrate a manufacturing of a first layer stack 120 with an embedded component 110 according to exemplary embodiments of the invention.

FIG. 1: a preform of the first layer stack 120 is provided, wherein the preform comprises a core of a (first) electrically insulating (e.g., core material or a (multi-) layer stack) layer structure 122. Above and below the core 122, there are arranged (first) electrically conductive layer structures 124. For example, the preform is a copper clad laminate (CCL) and the electrically conductive layer structures 124 are copper layers. A hole is formed through the upper electrically conductive layer structure 124, the electrically insulating layer structure 122, and the lower electrically conductive layer structure 124, in order to accommodate a component 110. In the example shown, the (electronic) component 110 is a chip such as a power chip or a high frequency chip. The chip 110 comprises electric contacts 111 (e.g., terminals, pads) at its lower exterior main surface. The chip 110 can also have electric contacts on the upper exterior main surface and/or any other main surface. The contacts 111 on the lower exterior main surface must be thermally conductive and can optionally (and preferably in order to reduce the footprint) be electrically conductive. The chip 110 is placed into the hole and onto a first temporary carrier structure 126 (below the preform) so that the electric contacts 111 are in contact with the temporary carrier structure 126.

FIG. 2: the electronic component 110 is now embedded in the preform of the first layer stack 120. Herefore, electrically insulating material (e.g., the same material as the core material) is applied (e.g., as a prepreg) into the hole and on the upper main surface of the electronic component 110. Application of electrically insulating material may be done by pouring, flowing, printing, etc. Afterwards, the electronic component 110 will be (fully) embedded/encapsulated with electrically insulating material 122 in the preform of the first layer stack 120. Optionally, a further layer of electrically conductive material 124 can be laminated on top of the preform (layer build-up).

FIG. 3: in this step, the first layer stack 120 is provided. The temporary carrier structure 126 is removed and the electric contacts 111 of the embedded electronic component 110 are exposed at the lower exterior main surface of the first layer stack 120. Thus, a main surface 114 of the embedded component 110 is flush with an outer main surface 121 of the first layer stack 120 (in the example shown flush with a first electrically conductive layer structure 124). Vias 112 are drilled (e.g., by laser drilling) through the electrically insulating layer structure 122 and the electrically conductive layer structure 124 on top of the electronic component 110. Then, the vias 112 are (completely) filled with electrically conductive material (e.g., copper). In order to protect the upper main surface 102 of the first layer stack 120, a first surface finish layer 127 is applied.

FIGS. 4 to 7 illustrate a manufacturing of a second layer stack 130 with an embedded thermally conductive block 150 according to exemplary embodiments of the invention.

Figures 4, 5, 6:
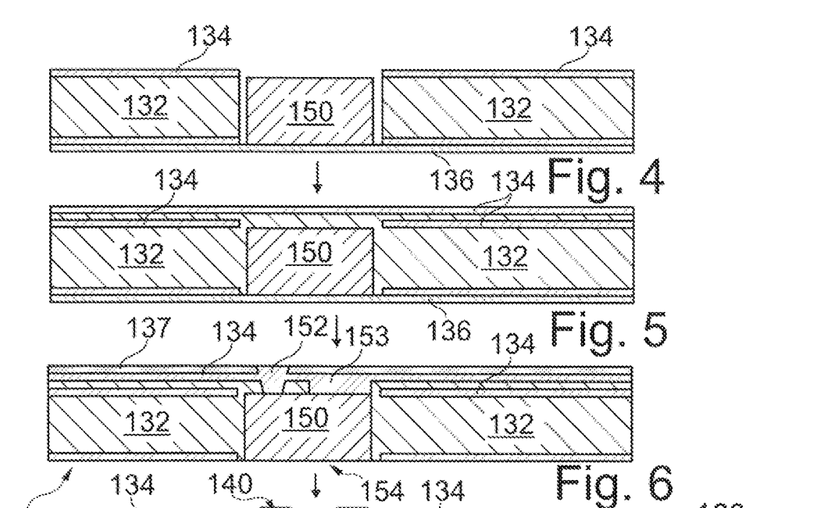
FIG. 4, FIG. 5, FIG. 6 and FIG. 7 illustrate a manufacturing of a second layer stack with an embedded thermally conductive block according to exemplary embodiments of the invention.

FIG. 4: a preform of the second layer stack 130 is provided, wherein the preform comprises a core of a (second) electrically insulating (core material) layer structure 132. Above and below the core 132, there are arranged (second) electrically conductive layer structures 134. A hole is formed through the upper electrically conductive layer structure 134, the electrically insulating layer structure 132, and the lower electrically conductive layer structure 134, in order to accommodate a massive thermally conductive block 150, which is in a preferred example a copper block. In this example, the block 150 does not need electric contacts 111 such as the electronic component 110, because it is already electrically conductive. The thermally conductive block 150 is placed into the hole and onto a second temporary carrier structure 136 so that the lower main surface of the block 150 is in contact with the temporary carrier structure 136.

FIG. 5: the thermally conductive block 150 is now embedded in the preform of the second layer stack 130. Herefore, electrically insulating material (e.g., the same material as the core material) is applied (e.g., as a prepreg) in the hole and on the upper main surface of the block 150. Afterwards, the block 150 will be (fully) embedded/encapsulated with electrically insulating material 132 in the preform of the second layer stack 130. Optionally, a further layer of electrically conductive material 134 can be laminated on top of the preform (layer build-up).

FIG. 6: in this step, the second layer stack 130 is provided. The temporary carrier structure 136 is removed and the lower main surface of the embedded block 150 is exposed at the lower main surface of the second layer stack 130. A via 152 is drilled (e.g., by laser drilling) through the electrically insulating layer structure 132 and the electrically conductive layer structure 134 on top of the block 150. Then, the via 152 is (completely) filled with electrically conductive material (e.g., copper). Next to the via 152, there is arranged an electrically conductive pad structure 153 which can be formed in the same manner as the via 152. In order to protect the upper main surface of the second layer stack 130, a second surface finish layer 137 is applied. After removing the temporary carrier structure 136, a main surface 154 (e.g., a planar copper surface) of the thermally conductive block 150 is flush with an outer main surface 131 of the second layer stack 130 (in the example shown flush with a second electrically conductive layer structure 134). The second layer stack 130 of FIG. 6 is applied to provide the component carrier 100 shown in FIG. 9.

Figure 7:
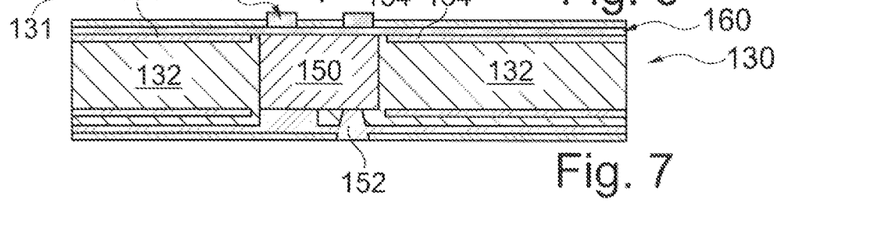

FIG. 7: the second layer stack 130 is turned around and a thermally conductive coupling medium 140 is applied to the thermally conductive block 150 before connecting the first layer stack 120 with the second layer stack 130. The thermally conductive coupling medium 140 comprises e.g., a thermally conductive paste (for example a sinter paste or a solder paste), a copper layer, and/or (micro) vias. In a preferred embodiment, the thermally conductive coupling medium 140 is also electrically conductive. After applying the thermally conductive coupling medium 140, said medium 140 is exposed at the upper surface (before lower surface) of the second layer stack 130. Optionally, an insulating layer 160 is arranged between the thermally conductive block 150 and the thermally conductive coupling medium 140. The second layer stack 130 of FIG. 7 is applied to provide the component carrier 100 shown in FIG. 8.

Figure 8:
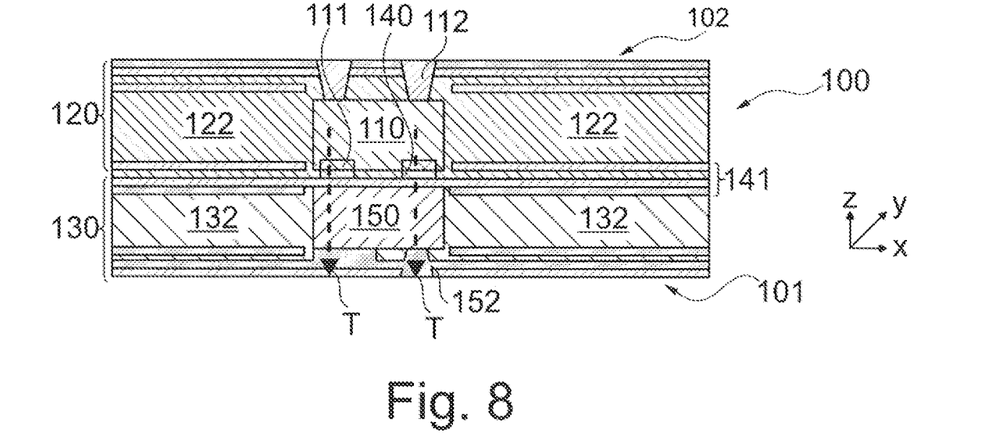
FIG. 8 illustrates a manufacturing of a component carrier that comprises the first layer stack and the second layer stack according to an exemplary embodiment of the invention.

FIG. 8 illustrates a manufacturing of a component carrier 100 that comprises the first layer stack 120 and the second layer stack 130 (as described above) according to an exemplary embodiment of the invention. The first layer stack 120 and the second layer stack 130 are connected with each other so that a thermal path T (depicted by arrows) from the embedded electronic component 110 via the thermally conductive block 150 up to the (lower) exterior main surface 101 of the component carrier 100 has a minimum thermal conductivity of at least 7 W/mK (in particular at least 40 W/mK). The thermally conductive coupling medium 140 is hereby applied at an interface 141 between the thermally conductive block 150 and the embedded electronic component 110. In this example, the thermally conductive coupling medium 140 is realized as thermally and electrically conductive pads. Connecting the thermally conductive block 150 and the embedded electronic component 110 can for example be achieved by using thermocompression bonding. In the example shown, the electric contacts 111 of the embedded electronic component 110 are coupled in a thermally (in particular also electrically) conductive manner to the thermally conductive coupling medium 140. The thermally conductive coupling medium 140 is further connected to the thermally (in particular also electrically) conductive block 150. Thus, the thermal path T can be defined to reach from the embedded electronic component 110, via the electric contacts 111, the thermally conductive coupling medium 140, and the via 152 (and/or pad 153) to the exterior main surface 101 of the component carrier 100. Hereby, the thermal path T is (essentially) oriented along the Z-axis of the component carrier 100, wherein the Z-axis is (essentially) along the height direction of the component carrier 100, which is perpendicular to the directions of main extension (along the X- and Y-axis) of the component carrier 100. In the described example, the thermal path T is continuously electrically conductive. The thermal path T has a minimum width of the width of the embedded electronic component 110 (and also of the thermally conductive block 150, because in the example shown, the embedded electronic component 110 and the block 150 have the same width). Electric signals of the embedded electronic component 110 can be conducted to both exterior main surfaces 101, 102 of the component carrier 100. In another example, said electric signals are exclusively conducted to the upper exterior main surface 102 of the component carrier 100 (through the vias 112). Both of said exterior main surfaces 101, 102 can be connected with a casing or a heat sink and/or a further (larger) block (not shown).

Figure 9:
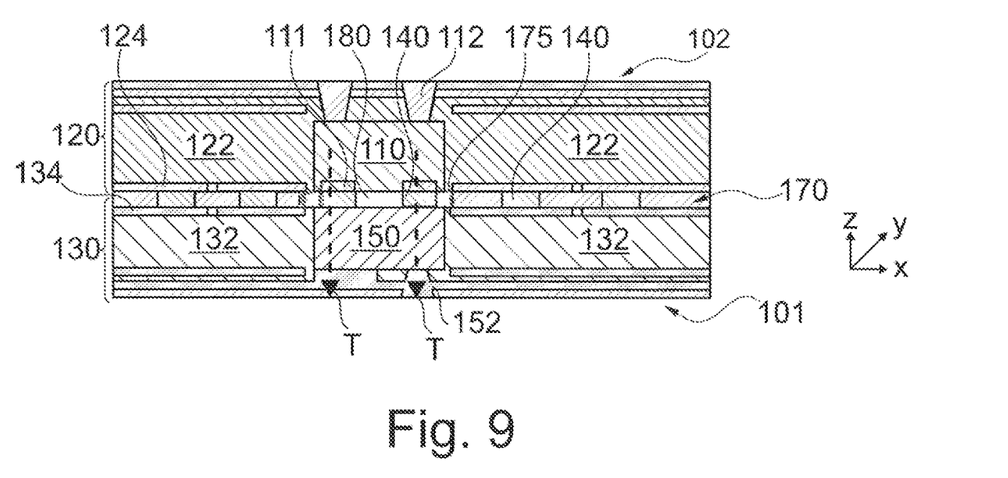
FIG. 9 illustrates a manufacturing of a component carrier that comprises the first layer stack and the second layer stack according to a further exemplary embodiment of the invention.

FIG. 9 illustrates a manufacturing of a component carrier 100 that comprises the first layer stack 120 and the second layer stack 130 (as described above) according to a further exemplary embodiment of the invention. The description of FIG. 8 also applies to FIG. 9 with the exception that in FIG. 9, an electrically insulating layer 170 directly connects the first layer stack 120 (wherein the component 110 is flush with the outer main surface 121) and the second layer stack 130 (wherein the thermally conductive block 150 is flush with the outer main surface 131). The electrically insulating layer 170 comprises an opening 175 at the interface 180 of the exposed component 110 main surface 114 and the exposed thermally conductive block 150 main surface 154. In the opening 175, there is arranged the thermally conductive material (e.g., paste) 140. Furthermore, the electrically insulating layer 170 comprises further openings 175 between a first electrically conductive layer structure 124 of the first layer stack 120 and a second electrically conductive layer structure 134 of the second layer stack 130. In this manner, further thermal (and electrical) conductive paths may be established between conductive layer structures 124, 134 of the layer stacks 120, 130.

It should be noted that the term "comprising" does not exclude other elements or steps and the articles "a" or "an" do not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE SIGNS

100 Component carrier
101 (lower) exterior (main) surface 102 (upper) further exterior (main) surface
110 Embedded (electronic) component
111 Electric contact, terminal
112 Electrically conductive via
114 Main surface component
120 First layer stack
121 Outer main surface first stack
122 First electrically insulating layer structure
124 First electrically conductive layer structure(s)
126 First temporary carrier
127 First surface finish
130 Second layer stack
131 Outer main surface second stack
132 Second electrically insulating layer structure
134 Second electrically conductive layer structure(s)
136 Second temporary carrier
137 Second surface finish
140 Thermal conductive coupling medium
141 Interface layer stacks
150 Thermally conductive block
152 Thermally (and electrically) conductive via
153 Thermally (and electrically) conductive structure/pad
154 Main surface thermally conductive block
160 Insulating connection layer
170 Electrically insulating layer
175 Opening
180 Interface component and block
T Thermal path

The invention claimed is:

1. A component carrier, comprising:
a first layer stack comprising a plurality of first electrically conductive layer structures and a plurality of first electrically insulating layer structures wherein the first layer stack is a first pre-manufactured stack;
a component embedded in the first layer stack;
a second layer stack comprising a plurality of second electrically conductive layer structure and a plurality of second electrically insulating layer structures, wherein the second layer stack is a second pre-manufactured stack; and
a thermally conductive block embedded in the second layer stack;
wherein the first layer stack and the second layer stack are connected with each other so that a thermal path from the embedded component via the thermally conductive block up to an exterior surface of the component carrier has a minimum thermal conductivity of at least 7 W/mK;
wherein the first layer stack and the second layer stack are laminated together;
wherein the first layer stack and the second layer stack are connected by an electrically insulating layer;
wherein the electrically insulating layer comprises an opening at an interface between the component and the thermally conductive block;
wherein at least a part of a thermally conductive coupling medium is arranged within the opening to thermally connect the component and the thermally conductive block;
wherein the electrically insulating layer is arranged between one of the first electrically conductive layer structures of the first layer stack and one of the second electrically conductive layer structures of the second layer stack,
wherein the electrically insulating layer comprises a plurality of openings between the first electrically conductive layer structures and the second electrically conductive layer structures, and
wherein in at least a part of the openings thermally conductive material is arranged in order to thermally connect the first electrically conductive layer structure and the second electrically conductive layer structure.

2. The component carrier according to claim 1,
wherein the thermal path is oriented at least partially along the Z-axis of the component carrier.

3. The component carrier according to claim 1,
wherein the thermal path is continuously electrically conductive.

4. The component carrier according to claim 1, wherein the thermally conductive coupling medium comprises at least one of the following features:
wherein the thermally conductive coupling medium comprises a thermally conductive paste;
wherein the thermally conductive coupling medium comprises a copper layer and/or conductive micro vias.

5. The component carrier according to claim 1,
wherein the embedded electronic component is a power chip or a high frequency chip.

6. The component carrier according to claim 1,
wherein the thermally conductive block is a metal block, in particular a copper block.

7. The component carrier according to claim 1,
wherein a lateral extension of the thermally conductive block is equal to or larger than a lateral extension of the embedded component.

8. The component carrier according to claim 1,
wherein the thermal path has a minimum width of at least the width of the embedded component.

9. The component carrier according to claim 1,
wherein the component is embedded such that a main surface of the component is flush with an outer main surface of the first layer stack.

10. The component carrier according to claim 1,
wherein the thermally conductive block is embedded such that a main surface of the thermally conductive block is flush with an outer main surface of the second layer stack.

11. The component carrier according to claim 1, further comprising at least one of the following features:
wherein an electric signal of the embedded component is conducted exclusively to a further exterior surface of the component carrier, wherein the further exterior surface opposes the exterior surface;
wherein the first layer stack and the second layer stack have different integration densities and/or are made of different materials.

12. The component carrier according to claim 1, comprising at least one of the following features:
wherein the at least one embedded component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one of the electrically conductive layer structures of the component carrier comprises at least one of the group consisting of copper, aluminum, nickel, silver, gold, palladium, and tungsten;

wherein the electrically insulating layer structure comprises at least one of the group consisting of reinforced or non-reinforced resin, epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide;

wherein the component carrier is shaped as a plate;

wherein the component carrier is configured as one of the group consisting of a printed circuit board, a substrate, and an interposer;

wherein the component carrier is configured as a laminate-type component carrier.

13. The component carrier according to claim 1, wherein the thermal path from the embedded component via the thermally conductive block up to the exterior surface of the component carrier has a minimum thermal conductivity of at least 40 W/mK.

14. A method of manufacturing a component carrier, comprising:

embedding a component in a first layer stack comprising a plurality of first electrically conductive layer structures and at least one first electrically insulating layer structure, wherein the first layer stack is a first pre-manufactured stack;

embedding a thermally conductive block in a second layer stack comprising a plurality of second electrically conductive layer structures and at least one second electrically insulating layer structure, wherein the second layer stack is a second pre-manufactured stack;

laminating the first layer stack and the second layer stack together;

connecting the first layer stack and the second layer stack by an electrically insulating layer, wherein the electrically insulating layer comprises an opening at an interface between the component and the thermally conductive block;

connecting the first layer stack with the second layer stack so that a thermal path from the embedded component via the thermally conductive block up to an exterior surface of the component carrier has a thermal conductivity of at least 7 W/mK;

arranging at least a part of a thermally conductive coupling medium within the opening to thermally connect the component and the thermally conductive block;

wherein the electrically insulating layer is arranged between one of the first electrically conductive layer structures of the first layer stack and one of the second electrically conductive layer structures of the second layer stack, wherein the electrically insulating layer comprises a plurality of openings between one the first electrically conductive layer structure and the second electrically conductive layer structures, and wherein in at least a part of the openings thermally conductive material is arranged in order to thermally connect one of the first electrically conductive layer structures and one of the second electrically conductive layer structures.

15. The method according to claim 14, further comprising:

applying the thermally conductive coupling medium at the interface between the thermally conductive block and the embedded component, wherein the thermally conductive coupling medium is applied to the thermally conductive block before connecting the first layer stack with the second layer stack.

16. The method according to claim 14, further comprising:

connecting the thermally conductive block and the embedded component using thermocompression bonding.

17. A component carrier, comprising:

a first layer stack comprising at least one first electrically conductive layer structure and at least one first electrically insulating layer structure;

a component embedded in the first layer stack;

a second layer stack comprising at least one second electrically conductive layer structure and at least one second electrically insulating layer structure; and a thermally conductive block embedded in the second layer stack;

wherein the first layer stack and the second layer stack are connected with each other so that a thermal path from the embedded component via the thermally conductive block up to an exterior surface of the component carrier has a minimum thermal conductivity of at least 7 W/mK;

wherein the first layer stack and the second layer stack are laminated together;

wherein the first layer stack and the second layer stack are connected by an electrically insulating layer;

wherein the electrically insulating layer comprises an opening at an interface between the component and the thermally conductive block;

wherein at least a part of a thermally conductive coupling medium is arranged within the opening to thermally connect the component and the thermally conductive block; and wherein the thermally conductive coupling medium comprises conductive micro vias.

* * * * *